United States Patent [19]  
Zavitsanos

[11] 4,092,263  
[45] May 30, 1978

[54] METAL VAPOR GENERATOR

[75] Inventor: Peter D. Zavitsanos, Norristown, Pa.

[73] Assignee: General Electric Company, Philadelphia, Pa.

[21] Appl. No.: 663,500

[22] Filed: Mar. 3, 1976

[51] Int. Cl.$^2$ ............................................. H01J 7/20
[52] U.S. Cl. ................................... 252/181.4; 75/66; 75/254; 75/200; 252/181.7; 252/188.3 R
[58] Field of Search .................. 29/182.1, 182; 75/66, 75/200, 202, 254; 252/188.3 R, 181.4, 181.7

[56] References Cited

U.S. PATENT DOCUMENTS

| | | | |
|---|---|---|---|
| 3,468,807 | 9/1969 | Spangenberg | 252/181.4 |
| 3,547,673 | 12/1970 | Bredzs et al. | 75/202 |
| 3,933,482 | 1/1976 | Dudko et al. | 75/202 |

FOREIGN PATENT DOCUMENTS 686,187  5/1964  Canada ................................. 75/202

Primary Examiner—Brooks H. Hunt  
Attorney, Agent, or Firm—James W. Johnson, Jr.

[57] ABSTRACT

A metal vapor generator comprises a slug prepared from: a mixture of titanium powders, boron powders, and certain other metal powders selected from a group consisting of: alkali metals (Na, K, Cs), alkali earths (Ba, Ca), groups (IVA (Sn, Ge, Si), aluminum, copper, and other metals whose boiling point is generally below 3500° C. The slug is reacted to generate heat and temperatures in excess of 2700° C, by which selected metals of the above group and mixture may be vaporized.

3 Claims, No Drawings

METAL VAPOR GENERATOR

The invention herein described was made in the course of or under a contract or subcontract thereunder with the Rome Air Development Center of the Department of the Air Force.

BACKGROUND OF THE INVENTION

1. Field of the Invention

This invention relates to a process and composition for vaporizing metals.

2. Description of the Invention

Detonation of nuclear weapons and devices in the upper atmosphere releases large amounts of metals and other materials that disturb the earth's normal atomspheric and terrestrial environments. The effect of releasing metals and other materials in the upper atmosphere, and the effect of "fallout" of these materials and metals upon the earth's surface is of great concern to man. Hence, numerous and various kinds of instrumentation systems such as communications systems, sensor systems, measuring systems, etc., are employed to control monitor and test the actual nuclear devices when exploding, and the properties of the earth's atmospheric and terrestrial environments before during and after utilizing the devices.

Unfortunately, when the earth's environment is disturbed by the use of these devices, instrument characteristics such as: dynamic characteristics, interference, signal-to-noise ratio attenuation, etc. of the instrumentation systems may also be adversely affected. To design and test the instrumentation systems to ensure that they operate with the reliability they were intended to, it is necessary to create environmental conditions equivalent to those conditions caused by using nuclear devices. However, it has been almost impossible to design and test certain instrumentation systems, for instance, sensor systems, for operational reliability under conditions created by using nuclear devices. This is so because of great difficulties encountered in releasing, by vaporization, metals like aluminum and barium into the earth's environments that could partially simulate the effects of a nuclear explosion.

In addition to the above, there are laser applications where metals that generally exist in a solid state such as: copper, tin and germanium are employed to lase in certain regions of the spectrum by changing the metals from the solid to a vapor or gaseous state. For example, in laser applications where copper is required to lase in the visible regions of the spectrum, it is necessary to initially vaporize solid copper. Some of the present methods require relying on electrical energy to vaporize and lase the solid copper. That is, solid copper is vaporized and the resulting copper vapor is excited by electrical discharge techniques by which the copper vapor is caused to emit coherent electro megnatic radiation in the green and yellow (or visible) regions of the spectrum. However, the equipment employed to create and excite the copper vapor is typically bulky, expensive and difficult to use in the field.

Likewise, new chemical lasers that are based on principles of oxidation of metal atoms existing in the gas phase present similar problems. Accordingly, classes of metals that are required in chemical laser applications (such as: tin, silicon and germanium within group IVA of the periodic table) are solids at room temperatures, and necessitate high temperatures to convert the solid metals into a gaseous state for subsequent oxidation.

The following equations illustrate these principles: Solid Metal + heat → gaseous metal + oxidant → (electronically excited) metal oxide → de-excited metal oxide + laser light or $M(s) + \text{heat} \rightarrow M_{(g)} + N_2O \rightarrow MO^* + N_2 + MO + N_2 + h\nu\text{-(laser light)}$.

Present chemical laser systems utilize resistively (electrically) heated furnaces to generate the necessary high temperatures. These furnaces, however, also make chemical laser systems both bulky and difficult to use in the field.

Thus, it is an object of this invention to provide a metal vapor generator and a process for vaporizing metals from the solid to the vapor or gaseous state.

It is another object of this invention to provide a metal vapor generator for releasing vaporized aluminum and barium in the earth's atmosphere to provide partial simulation of the effects of nuclear explosions.

It is yet another object of this invention to provide a metal vapor generator for vaporizing metals which are used as lasing gases in chemical laser applications.

It is still another object of this invention to provide a metal vapor generator and process for utilizing heat energy released during the formation of titanium diboride ($TiB_2$) from titanium and boron to vaporize selected metals existing in a solid state.

SUMMARY OF THE INVENTION

A mixture including titanium powders, of an average particle size of 2 microns, and boron powders, of an average particle size of 0.044 microns, are combined in a ratio of one gram-atom of titanium to two-gram atoms of boron. Eighty percent by weight of the mixture is added to 20% by weight of other metals selected from: the groups of alkali metals (Na, K, Cs), alkali earths (Ba, Ca), groups IVA (Sn, Ge, Si); aluminum, copper, and other metals whose boiling point is generally below 3500° C.

A slug is formed from the mixture of titanium/boron and metal powders. When applicable, a latex adhesive, having a ratio of 100 parts of resin to 65 parts of binder by weight to the mixture of titanium/boron and metal powders, is included to aid in forming and binding the slug. The slug's configuration may be altered to any desired shape.

Additionally, the slug is sequentially dried under ambient conditions for approximately 18 hours, and further dried at temperatures of around 80° C for about four hours. Lastly, the slug is both molded in a metal press at 30,000 pounds per square inch and sintered at 200° C for about one hour. Alternatively, the slug may be sintered at a temperature between 100° C–120° C under 30,000 pounds pressure.

The resulting slug composition, after being subjected to the above process techniques, constitutes a metal vapor generator. The metal vapor generator undergoes an exothermal chemical reaction when initiated with: a Pyrofuse wire, an electrically heated tungsten filament, or an explosive initiator. Heat is released at a rate of 1.1 kcal/gm of mixture, and generates temperatures in the range of 3,000° C to 3,300° C. The heat vaporizes the metal powders selected from the above mentioned groups in accordance with the following chemical equation:

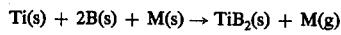

$$Ti(s) + 2B(s) + M(s) \rightarrow TiB_2(s) + M(g)$$

where M is the selected metal element of interest.

DETAILED DESCRIPTION OF THE INVENTION

A metal vapor generator, that vaporises metals from the solid to the gaseous state and releases the vaporized metals for utilization in various applications such as: partially simulating nuclear explosions, and lasers applications, comprises a slug mixture of composition. The mixture includes: titanium, boron, metal powders selected from the group consisting of alkali metals (Na, K, Ca), alkali earths (Ba, Ca), Group IV metals (Sn, Ge, Si), aluminum, copper, and yet other metals whose boiling points are generally below 3500° C.

To prepare the metal vapor generator, 2 micron particle size titanium powders and 0.044 micron particle size boron powders are mechanically mixed in a conventional mixer in a ratio of one gram-atom of titanium (47.9g) to two gram-atom of boron (21.6g). The titanium/boron mixture is added to desired metal powders selected from the aforementioned groups.

When applicable, a commerically available latex adhesive or its equivalent is added to the titanium/boron mixture and selected metal powders. The adhesive is preferably added in a ration of about 100 parts of an organic resin to about 65 parts of binder by weight to the mixtures of titanium/boron and metal powders. The adhesive functions to aid in bonding the various above named powders into a slug. The slug has a configuration which is alterable and may be shaped into many forms. In a preferred embodiment, the slug is shaped to have an elongated tubular configuration.

To continue, the slug is sequentially dried under ambient or room temperatures for approximately 18 hours, and is further dried at temperatures around 80° C for about four hours. Next, the slug is pressed in a metal mold at about 30,000 pounds per square inch, and subjected to sintering at 200° C for approximately one hour. In an alternate sintering process cycle, sintering is done at temperatures between 100° C to 120° C under 30,000 pounds per square inch pressure for approximately three to five hours.

Upon completion of the above process cycles, the slug is still a metal mixture in a solid state and constitutes a metal vapor generator. The metal vapor generator vaporizes desired metals selected from the above delineated group from either a solid or condensed phase when the generator is caused to exothermically react. The equation for the exothermic reaction is as follows:

$$Ti(s) + 2B(s) + M(s) \rightarrow TiB_2(s) + M(g)$$

where M designates the selected metal of interest.

The reaction is initiated with either a pyrofuse wire, an electrically heated tungsten filament, or any conventional equivalent type initiator. The generator, while reacting, generates heat and temperatures of sufficient level to vaporize the previously named metal powders of interest. The generated temperatures are in excess of 2700° C.

The following incomplete list of advantages are attributed to the generator: the reaction efficiently and almost completely vaporizes the entire solid metal selected; barium and alkalis may be released in the atmosphere to create a plasma that duplicates some of the effects of nuclear explosions whereby instrumentation systems may be checked for reliability, effectiveness, and workability; thick and thin films of the released metal vapors may be deposited on glass or other substrates; and the metal vapors may be used in laser applications such as for fuels in chemical lasers and for electrically pumped metal vapor lasers, for instance copper vapor lasers.

It is obvious that it is possible to produce still other embodiments of a metal vapor generator without departing from the scope of the inventive concept herein disclosed. Accordingly, it should be understood that all matter contained in the above description should be interpreted as illustrative and not limited in a limiting sense.

What is claimed as new and desires a U.S. Letters Patent is:

1. A metal vapor generator comprising a mixture of:
   (a) 80% of boron powders and titanium powders combined with one another in a ratio of 1 gram-atom of titanium to about 2 gram-atoms of boron; and
   (b) 20% of a metal powder selected from the group consisting of copper, aluminum, alkali metals, alkali earths, group IV A metals and other metals whose boiling point is below 3500° C.

2. A metal vapor generator as recited in claim 1, and wherein said mixture of boron powders and titanium powders comprises 0.044 micron particle size of said boron powders and 2 micron particle size of said titanium powders.

3. A metal vapor generator as recited in claim 2, further comprising: an adhesive of about 1% solids and a ratio of about 100 parts of resin to about 65 parts binder by weight to said mixture of titanium/boron and other metal powders.

* * * * *